US010003340B2

(12) United States Patent
Lung (10) Patent No.: US 10,003,340 B2
(45) Date of Patent: Jun. 19, 2018

(54) MULTI-FORMAT DRIVER INTERFACE

(71) Applicant: Microsemi Semiconductor ULC, Kanata (CA)

(72) Inventor: Chi Yu Lung, Kanata (CA)

(73) Assignee: Microsemi Semiconductor ULC, Kanata, Ontario (CA)

( * ) Notice: Subject to any disclaimer, the term of this patent is extended or adjusted under 35 U.S.C. 154(b) by 0 days. days.

(21) Appl. No.: 15/653,740

(22) Filed: Jul. 19, 2017

(65) Prior Publication Data

US 2018/0048312 A1 Feb. 15, 2018

Related U.S. Application Data

(60) Provisional application No. 62/372,875, filed on Aug. 10, 2016.

(51) Int. Cl.
| | |
|---|---|
| H03K 19/0185 | (2006.01) |
| H03K 19/0175 | (2006.01) |
| H03K 17/693 | (2006.01) |
| H03K 19/094 | (2006.01) |
| G06F 13/368 | (2006.01) |
| H03K 17/687 | (2006.01) |
| H03K 5/134 | (2014.01) |

(52) U.S. Cl.
CPC ... *H03K 19/018571* (2013.01); *G06F 13/368* (2013.01); *H03K 5/134* (2014.07); *H03K 17/6871* (2013.01); *H03K 19/017518* (2013.01); *H03K 19/018521* (2013.01); *H03K 19/018585* (2013.01); *H03K 19/09429* (2013.01)

(58) Field of Classification Search
CPC combination set(s) only.
See application file for complete search history.

(56) References Cited

U.S. PATENT DOCUMENTS

| | | | | |
|---|---|---|---|---|
| 6,870,391 B1* | 3/2005 | Sharpe-Geisler | .......... | H03K 19/018585 326/37 |
| 7,495,475 B2* | 2/2009 | Suzuki | .......... | H03K 19/018528 326/62 |
| 7,965,121 B2* | 6/2011 | Luo | ................ | H03K 19/018528 327/108 |
| 2005/0088428 A1 | 4/2005 | Liu et al. | | |

OTHER PUBLICATIONS

Holland; Interfacing Between LVPECL, VML, CML, and LVDS Levels; Texas Instruments, SLLA120—Dec. 2002.

* cited by examiner

*Primary Examiner* — An Luu
(74) *Attorney, Agent, or Firm* — Simon Kahn (57) ABSTRACT

A multi-format signal driver interface has first, second and third pairs of transistors arranged in a back-to-back relationship. First transistors and second transistors of the first and second pairs of transistors form respective first and second parallel arrangement. The first transistors of the third pair of transistors are in series with the first parallel arrangement, and the second transistors of the third pair of transistors are in series with the second parallel arrangement. The sizing of the second pair of transistors is greater than the first and third pairs of transistors. A pre-driver module configures the multi-format signal driver interface to output a selected signal format. A differential amplifier is selectively coupleable to said pre-driver module to provide a common mode voltage. In each format the interface employs a current loop in the output. The transistor pairs are one-to-one loaded in each mode.

23 Claims, 6 Drawing Sheets

MULTI-FORMAT DRIVER INTERFACE

CROSS REFERENCE TO RELATED APPLICATION

This application claims the benefit under 35 USC 119(e) of U.S. provisional application No. 62/372,875 filed Aug. 10, 2016, the contents of which are herein incorporated by reference.

FIELD OF THE INVENTION

This invention relates to the field of data communications, and in particular to a multi-format driver interface for coupling different signaling logic types, such as CIVIL (Current Mode Logic), LVPECL (Low-Voltage Positive/pseudo-Emitter Coupled Logic), LVDS (Low-Voltage Differential Signaling), and HCSL (High-Speed Current Steering Logic).

BACKGROUND OF THE INVENTION

LVPECL, LVDS, HCSL signal formats are widely used in high speed data communications, especially for signal frequencies between 20 MHz and 1 GHz. The CML signal format is commonly used internally within high-speed devices. There is a need for a driver interface that can accept a CIVIL format signal and output that signal in a different format, such as LVPECL, LVDS, or HCSL. The driver interface should be able to select the appropriate output format under the control of a simple logic input. The driver interface needs to be able to handle the different loading and powering conditions of the various formats. In general terms, LVPECL requires an 800 mV swing with a common mode voltage of 2V, LVDS requires a 400 mV swing with a common mode voltage of 1.2 V and HCSL requires steering a current of 15 mA alternately between the positive and negative outputs.

Figure 1:
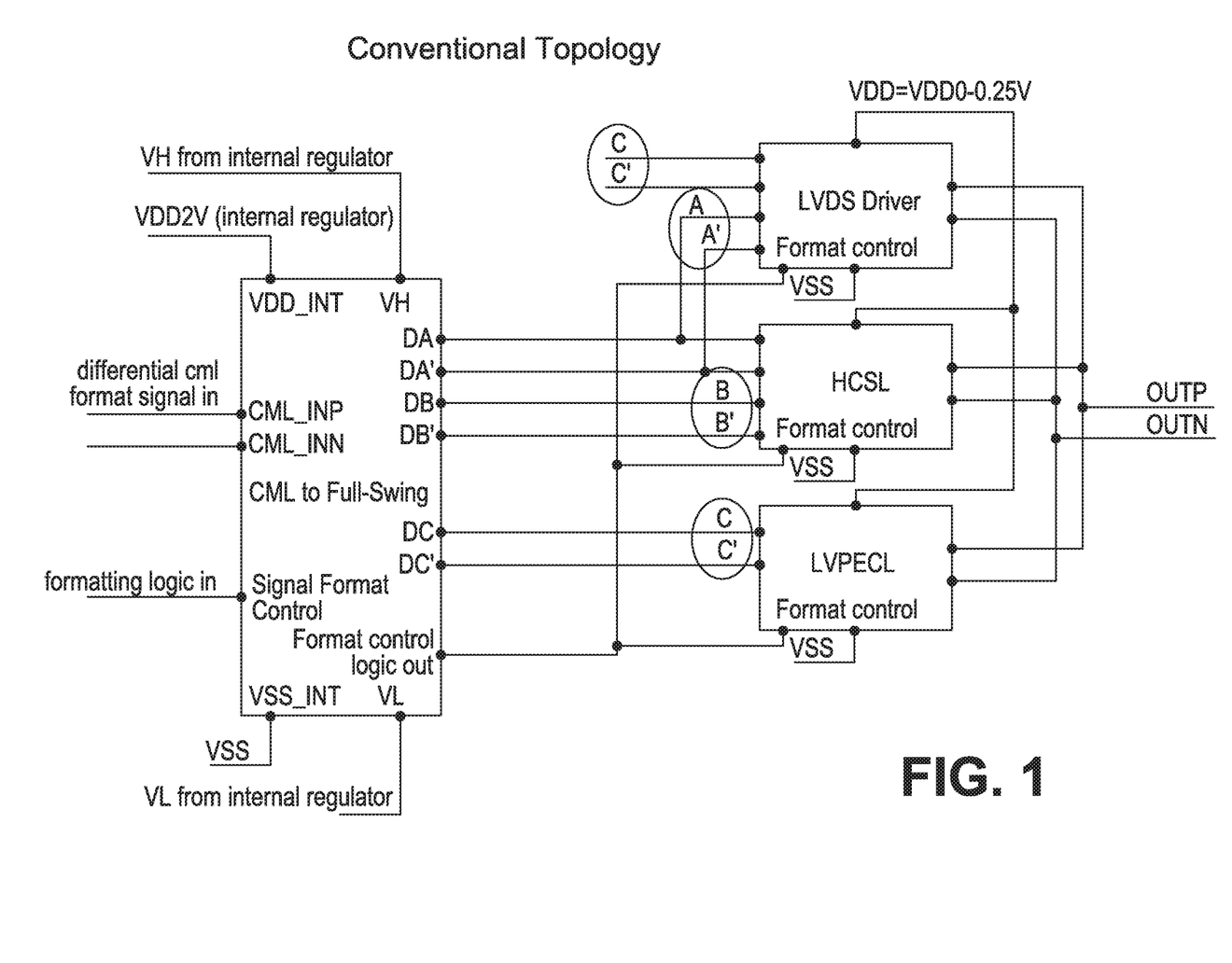
FIG. 1 a is a schematic diagram of a prior art multi-format driver.

FIG. 1 is a schematic diagram of a conventional multi-format driver interface. There are three separate output driver stages in parallel, corresponding respectively to LVDS, HCSL, and LVPECL, driven by the CML-to-Full-Swing pre-driver module. The output format is selected by an input formatting_logic_in.

In CIVIL logic, the transistors are never in saturation. The input/output voltages have a small swing, which is converted into a full swing in the CIVIL-to-Full-Swing pre-driver module to drive, via data outputs DA/DA', DB/DB', and DC/DC', transistor pairs having their respective gates coupled to connection lines AA', BB', CC' respectively.

Connection lines AA' are connect to the gates of the P-channel transistors used for LVDS and HCSL. Connection lines BB' connect to the gates of the P-channel transistors used for HCSL. The connection lines CC' connect to the gate of N-channel transistor used for LVPECL and LVDS.

Figure 2:
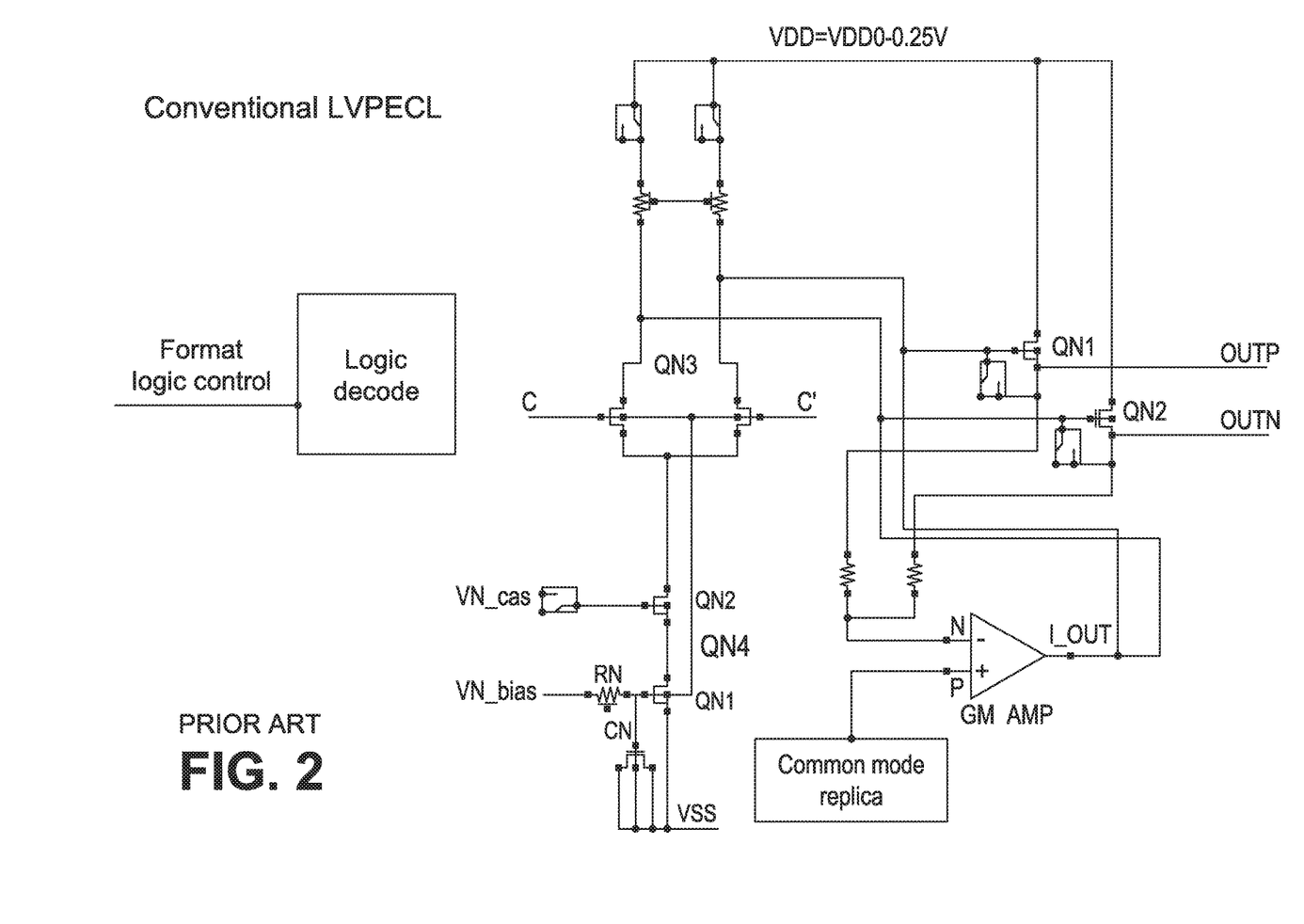
FIG. 2 is a schematic diagram of a prior art LVPECL driver.
Figure 3:
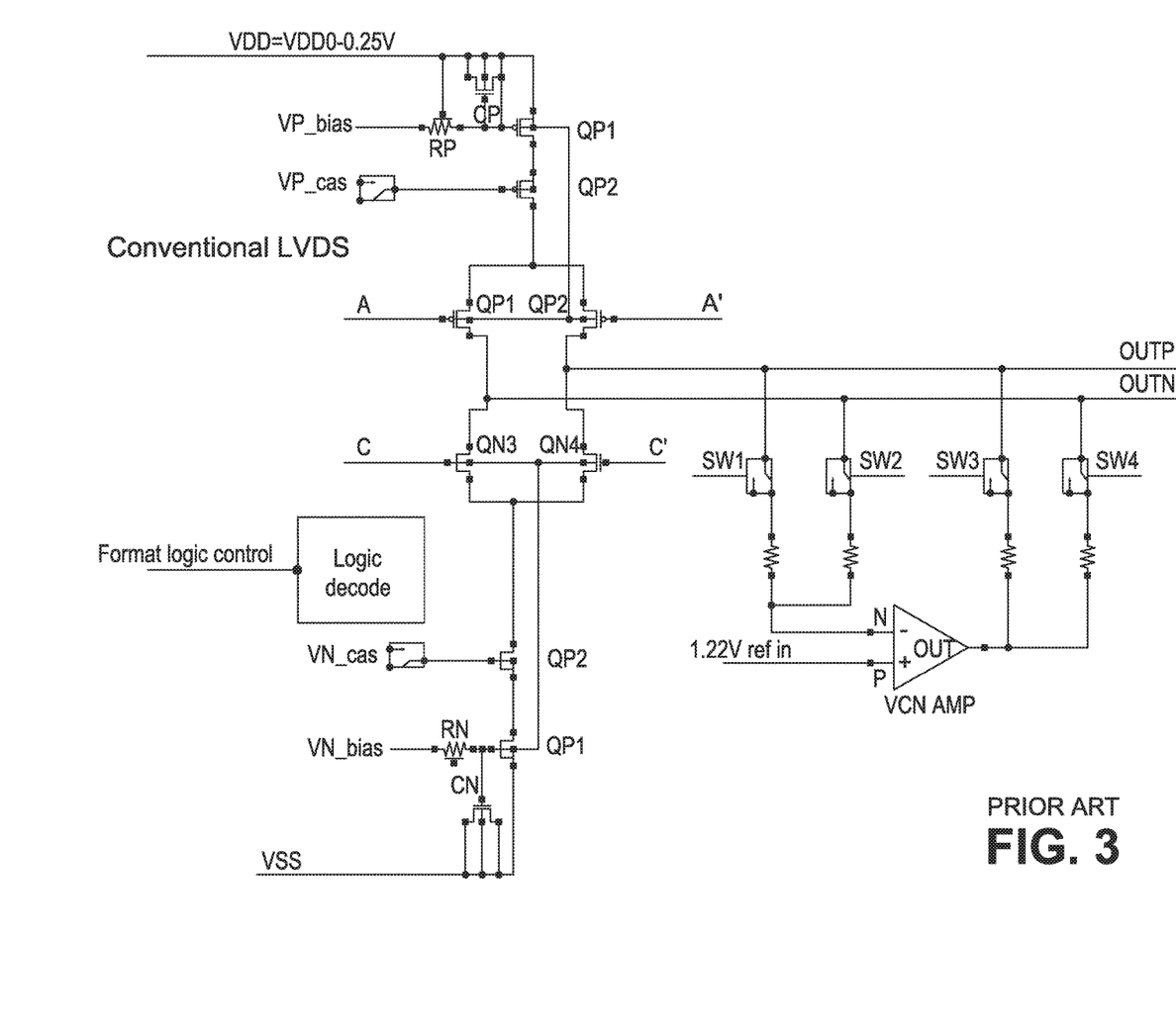
FIG. 3 is a schematic diagram of a prior art LVDS driver.
Figure 4:
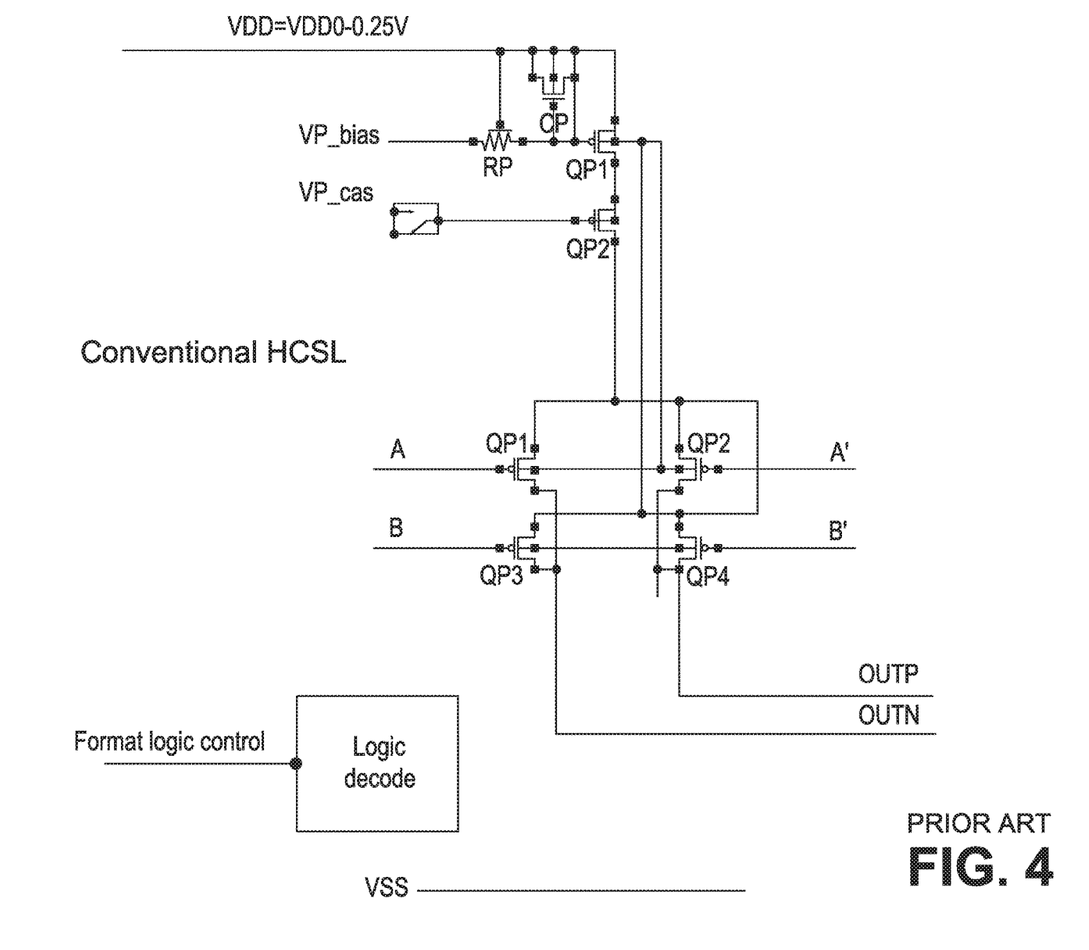
FIG. 4 is a schematic diagram of a prior art HCSL driver.

The transistor pairs, which are the source transistors providing the necessary current for the relevant output signal format, are shown in FIGS. 2 to 4 as QP1/QP2, QP3/QP4, and QN3/QN4, where N and P refer to the channel type of the transistor. Both the transistor pairs QP1/QP2 and QN3/QN4 coupled to connection lines AA' and CC' are double-loaded, which means that drive more than one physical load. The pair QP1/QP2 is loaded for both LVDS and HCSL. The pair QN3/QN4 is loaded for LVDS and LVPECL. This is a drawback from the point of view of power consumption and signal conditioning, especially in high speed applications where the rise and fall time of the signal is critical to noise performance. More loading means degradation of the rise and fall time, and thus noise performance. In order to maintain a fast rise fall and time the transconductance (gm) of the driver stage needs to be improved, either by increasing its size (larger die area), or by increasing its biasing current (power consumption), and more likely both. This approach is not efficient in terms of both area and power.

FIG. 2 is an example of a prior art LVPECL driver, FIG. 3 is an example of an LVDS driver, and FIG. 4 is an example of a prior art HCSL driver, which can all be combined as shown in FIG. 1 into a multi-format interface.

While the LVDS and HCSL drivers employ current loops, a typical prior art LVPECL driver consists of a CML stage with a source (e.g. emitter) follower. Conventional wisdom is that a source follower is a necessary component of an LVPECL driver. As a result it is difficult to combine an LVPECL driver with current loop drivers, such as LVDS and HCSL because large switches are required to turn off the source follower of the LVPECL driver, leading to an expensive design in terms of die area.

In the prior art, the output loading of the arrangement of FIG. 1 can be described as follows:
  LVPECL
  QN1,QN2 (intrinsic)
  QP1,QP2,QP3,QP4 (from HCSL)
  QP1,QP2,QN3,QN4 (from LVDS)
  HCSL
  QP1,QP2,QP3,QP4 (intrinsic)
  QP1,QP2,QN3,QN4 (from LVDS)
  QN1,QN2 (from LVPECL)
  LVDS
  QP1,QP2,QN3,QN4 (intrinsic)
  QP1,OP2,OP3,OP4 (from HCSL)
  QN1,QN2 (from LVPECL)

In the prior art interface, the filtering of the biasing current for noise considerations is achieved by components RP/CP and RN/CN for LVDS, by components RN/CN for LVPECL, and by RP/CP for HCSL. Components RP/CP and RN/CN take up a large die area The control of the biasing point is achieved by transistor pairs QP1/QP2 and QN3/QN4 for LVDS; QN3/QN4 for LVPECL; and QP1/QP2 and QP3/QP4 for HCSL. The pair QP1/QP2 can be optimized for both LVDS/HCSL, and the pair QP3/QP4 can be optimized for HCSL with the appropriate choice of the input driving signal from the CML-to-Full-Swing module. The input driving signal should have the right input slew rate (i.e. good rise and fall time), and steady state voltage levels (VH and VL, respectively corresponding to the logic 1 and logic 0 states).

The transistor pair QN3/QN4 cannot be optimized for both LVPECL and LVDS due to their different output common mode voltages. The VH and VL input driving signals cannot be optimized for both formats, so in order to have good noise performance, a separate driving stage for LVDS and LVPECL is required, thus making the die area larger and the power consumption greater.

SUMMARY OF THE INVENTION

Embodiments of the invention provide a combined multiple format driver interface that can handle different types of low-level differential signaling with one common driver configuration. They have a small die area, low power consumption, and reduced output noise.

The invention is based in part on the realization that contrary to conventional wisdom an LVPECL driver does not require a source follower. The LVPECL driver can be implemented as a current loop driver in the same way as LVDS and HCSL drivers. With proper selection of the transistor sizing for a certain technology (e.g. CMOS), the output signal integrity can be as good as with using a pair of source followers. With the LVPECL driver in the current loop format, the inventors have then inventively combined it with the other two current loop format drivers (i.e. LVDS and HCSL). Double-loading can advantageously be avoided, leading to better signal integrity and less power consumption.

According to the present invention there is provided a multi-format signal driver interface, comprising first and second current sources coupled to respective power rails; first, second and third pairs of switching transistors coupled in a back-to-back relationship between said first and second current sources, first switching transistors of said first and second pairs of switching transistors forming a first parallel arrangement, and second switching transistors of said first and second pairs of switching transistors forming a second parallel arrangement, first switching transistors of said third pair of transistors being in series with said first parallel arrangement, and second switching transistors of said third pair of switching transistors being in series with said second parallel arrangement, sizing of said second pair of sizing transistors being greater than said first and third pairs of switching transistors; a first output line coupled to a junction point between said first parallel arrangement and said first switching transistors of said third pair of switching transistors; a second output line coupled to a junction point between said second parallel arrangement and said second switching transistors of said third pair of switching transistors; a pre-driver module for generating control signals to configure said current sources and said switching transistors to output a selected signal format on said output lines; and a differential amplifier selectively couple-able to said output lines for providing a common mode voltage.

The interface is typically fabricated using integrated circuit technology, for example, 0.18 µm CMOS technology. The "sizing" as used herein refers to the physical dimensions of the transistors, which affects both their transconductance and input capacitance. The sizing depends on the particularly technology used, but in the case of 0.18 µm CMOS technology the sizing of the gates first and third pairs of transistors is 80 µm in width by 0.35 µmin length. The sizing of the second pair of transistors can be achieved by providing each effective transistor of the pair as multiple transistors arranged in parallel. Consequently, as used herein the term "transistor" includes an arrangement of transistors connected in parallel, that is with their respective sources, drains and gates all tied together.

The three transistor pairs are all one-to-one loaded, meaning they drive only one physical node. As a result the driver interface reduces power consumption and offers better signalling conditions.

According to another aspect of the invention there is provided a method of outputting a selected signal format employing a multi-format signal driver interface, comprising: first and second current sources coupled to respective power rails; first, second and third pairs of switching transistors coupled in a back-to-back relationship between said first and second current sources, first switching transistors of said first and second pairs of switching transistors forming a first parallel arrangement, and second switching transistors of said first and second pairs of switching transistors forming a second parallel arrangement, first switching transistors of said third pair of transistors being in series with said first parallel arrangement, and second switching transistors of said third pair of switching transistors being in series with said second parallel arrangement, sizing of said second pair of sizing transistors being greater than said first and third pairs of switching transistors; a first output line coupled to a junction point between said first parallel arrangement and said first switching transistors of said third pair of switching transistors; a second output line coupled to a junction point between said second parallel arrangement and said second switching transistors of said third pair of switching transistors; and a differential amplifier selectively couple-able to said output lines for providing a common mode voltage, said method comprising in an LVPECL mode driving said first and second pairs of transistors while holding said third pair of transistors in an off state, and coupling said differential amplifier to said output lines to provide a common mode voltage; in an HCSL mode driving said first and second pairs of transistors while holding said third pair of transistors in an off state while de-coupling said differential amplifier from said output lines; and in an LVDS mode driving said first and third pairs of transistors while holding said second pair of transistors in an off state, and coupling said amplifier to said output lines to provide a common mode voltage.

BRIEF DESCRIPTION OF THE DRAWINGS

This invention will now be described in more detail, by way of example only, with reference to the accompanying drawings, in which:—

DETAILED DESCRIPTION OF PREFERRED EMBODIMENTS

An embodiment of the invention will now be described with reference to FIG. 5. The output circuit 10 comprises a P-channel current source 40, comprising transistors 41, 42 coupled to the power rail VDD, and an N-channel current source 43 comprising transistors 44, 45 coupled to the power rail VSS. The magnitude of the current produced by the current sources 40, 43 is determined by the respective control voltages VP_bias, VP_cas, VN_bias, and VN_cas. These control voltages are selected by pre-driver module 12 according to the operating mode determined by the formatting-logic-in signal applied to the pre-driver module 12.

The current sources 40, 43 can also be switched off by a power-down signal pdown_Pchannel, pdown_Nchannel, respectively, from the pre-driver module 12. The pdown_Pchannel, pdown_Nchannel signals control switches 46, 47 supplying control voltages to the gates of transistors 42, 44. In all three operational modes LVPECL, LVDS, and HCSL, the power down signal pdown_Pchannel is de-asserted so control switch 46 is on. In LVDS and HCSL modes, control switch 47 is off, whereas in LVPEC mode control switch 47 is on. In a standby mode with no output, both control switches 46, 47 can be turned off.

In the non-limiting exemplary embodiment, the bias voltage generator is incorporated in the pre-driver module 12, although it will be appreciated that this can be implemented as a separate component.

Three pairs of output driver or switching transistors QP1/QP2, QP3/QP4, and QN3/QN4 having their gates connected respectively to connection lines AA', BB', CC' are arranged between the current sources 40, 43. These switching transistors impress the data signals on the current generated by current sources 40, 43 in response to commands DA, DA', DB, DB', DC, DC' received from the pre-driver module 12 coupled to connection lines AA', BB', CC', respectively.

Switching transistor QP1 is in series with switching transistor QN3, and switching transistor QP2 is in series with switching transistor QP4 between current sources 40 and 43. Transistor QP1 forms a parallel arrangement with transistor QP3, and transistor QP2 forms a parallel arrangement with transistor QP4. With this arrangement transistor pair QP1/QP2 can be in series with transistor pair QN3/QN4, transistor pair QP3/QP4 can be in series with transistor pair QN3/QN4, and transistor pairs QP1/QP2 and QP3/QP4 can together be in series with transistor pair QN3/QN4.

In operation for LVPECL output, both QP1/QP2 and QP3/QP4 are turned on, and QN3/QN4 is turned off. The N-channel current source 43 is also turned off by assertion of the pdown_Nchannel signal thus coupling the gate of transistor 44 to VSS via switch 47. In one exemplary embodiment the current source 40 is set to 18 mA by the appropriate level on signal VP_bias.

For LVDS output, the transistor pairs QP1/QP2 and QN3/QN4 are turned on, and the transistor pair QP3/QP4 is turned off. The N-channel current source 43 is turned on by de-assertion of the pdown_Nchannel signal thus coupling the gate of transistor 44 to VN_cas via switch 47. The current sources 40, 43 are set to 3.5 mA by the appropriate levels of signals VP_bias, VN_bias.

For HCSL output, both transistor pairs QP1/QP2 and QP3/QP4 are turned on, and transistor pair QN3 and QN4 is turned off. The N-channel current source 43 is turned off by assertion of the pdown_Nchannel signal. The current source 40 is set to 15 mA.

Typically, in LVPECL mode, the loading for each output terminal at the receiver is 50 ohms coupled to a voltage source of VDDO−2V, where VDDO is the external supply voltage. The 50 ohm loading at the receiver may be provided by a Thevenine pair of resistors of 83 and 125 ohms, with one side of the 83 ohm resistor connected to VDDO and one side of the 125 ohm resistor connected to ground.

For a logic '1' output, responsive to a respective driving signal presented on connection lines AA', BB', the output current on line 13 may be 18 ma. For a logic 0, the output current on line 13 may be 4 ma. The current from current source 40 is channeled via transistors QP2, QP4 to output line 13 (OUTP). In each case from the sender's point of view, the current flows out of the device, with more current flowing out for a logic 1 than for a logic 0. 18 mA current from the current source 40 is steered through transistors QP1/QP3 to output line 11 into a 50 ohm load resulting in 0.9V on the load.

The current flow is similar for output line 13 with the current being channeled through transistors QP2/QP4.

In the LVPECL mode, differential amplifier 14 acts to ensure a predetermined common mode voltage by increasing, or decreasing current through output lines 11, 13, respectively.

In HCSL mode, the operation is similar except the loading is simply 50 ohm each on each output line 11, 13 to ground, and current source 40 is set to 15 mA by the appropriate setting of VP_bias.

The sizing of the pairs of transistors is significant. In this non-limiting exemplary embodiment the transistor pairs QP1/QP2 and QN3/QN4 have the same size, and the transistor pair QP3/QP4 is about 3-5 times, preferably 4 times, larger than the pairs QP1/QP2 and QN3/QN4.

The size here refers to the product of the gate width and gate length of the CMOS transistor. For example, in one embodiment the size of each of transistors QP1/QP2 and QN3/QN4 is 80 μm (gate width) by 0.35 μm (gate length). An effective transistor for the pair QP3/QP4 4 times this size can be can be provided by connecting four transistors of the same size as QP1/QP2 in parallel with their drains, sources and gates respectively tied together. If it were desired to make the transistor pair QP3/QP4 5 times larger, then five transistors would be connected in parallel and so on. Alternatively, the increase in sizing could be achieved by physically making the transistors QP3, QP4 physically larger and using a single larger transistor for each, although this latter approach is not preferred because the threshold voltage (Vt) for the single large transistor QP3, QP4 will not be the same as the other transistors.

For example, if the reference or unity transistor is 80 μm by 0.3 μm (W/L is 80 μm/0.3 um), and the secondary is 400 μm by 0.3 μm, the preferred solution is to provide 4 or 5 of the unity transistors connected in parallel.

Alternatively, it is possible to use a transistor of dimensions 400 μm by 0.3 μm (400 μm/0.3 μm), although as noted this is not the preferred solution because the threshold voltage Vt for this transistor will be different.

The ratio 4 is chosen to ensure minimal die area and power consumption. The current loop requirements are for LVPECL, 18 mA, for and HCSL, 15 mA and for LVDS 3.5 mA.

As noted above, for LVDS the transistor pair QP1/QP2 and QN3/QN4 are used. The current density of those transistors should be made as close as possible. Thus QP1/QP2 and QN3/QN4 are the unity or base size transistor for 3.5 mA loop current.

For LVPECL the pair QP1/QP2 and QP3/QP4 are used. The transistors QP1/QP2 and QP3/QP4 are now responsible for passing 18 mA, which is the current loop requirement for LVPECL. To achieve the same current density the size of the pair QP3/QP4 should therefore be about 4.14 times unity, since 18 mA is now being shared among all transistors, and 18 mA is 5.14 times 3.5 mA, which is the current loop requirement for LVDS.

For HCSL, the pair QP1/QP2 and QP3/QP4 are used, and the transistors QP1/QP2 and QP3/QP4 are now responsible for passing 15 mA, which is the current loop requirement for HCSL. For the same current density the size of QP3/QP4 should therefore be about 3.29, since 15 mA is now being shared among all transistors, and 15 mA is 4.29 times 3.5 mA). Since transistors are generally formed in integer multiples of the unity size, this makes an average ratio of 4 is a suitable choice. A preferred range would be 3 to 5. A ratio of higher than 4 can be used at the expense of higher power consumption and die area.

The ratio of the size of the pair QP3/QP4 to the size of the pairs QP1/QP2, and QN3/QN4 is important in matching the rise and fall time of the signaling. The acceptable range of sizes for the pairs QP1/QP2, and QN3/QN4 depends on the technology used. With 0.18 μm CMOS technology, a presently preferred size is 80 μm (gate width) by 0.35 μm. Those skilled in the art will recognize that the gate length of 0.35 μm is currently the minimum gate length of a N-channel pad transistor in 0.18 μm CMOS technology. For a minimum area target, the minimum gate length is used whenever possible to ensure small area for a given aspect ratio (i.e. the ratio between gate width to gate length of the transistor).

The connection lines AA', BB', CC' coupled respectively to the gates of the transistor pairs QP1/QP2, QP3/QP4, and QN3/QN4 are connected to the respective data outputs DA/DA', DB/DB', and DC/DC' of the pre-driver module 12, which is the similar to the "CML-to-Full-Swing" module employed in the prior art as shown in FIG. 1. These outputs are the data signals that determine the output of the driver circuit.

The pre-driver module 12 converts the CML signal, which is a current mode signal referenced to $V_{DD}$. The signal level is usually between 0.5V to 0.8V. The logic '1' for a CML signal is simply $V_{DD}$, and logic '0' is $V_{DD-X}$ (where X is 0.5V to 0.8V). The pre-driver module 12 converts this signal to full swing with the upper supply as VH and lower supply as VL so that after the conversion a logic '0' will now be VL instead of $V_{DD-X}$, and logic '1' will now be VH instead of $V_{DD}$. Output line 11 is connected to the drain of transistor QN3 and the drains of transistors QP1 and QP3 at junction point 11a. Output line 13 is connected between the drain of transistor QN4 and the drains of transistors QP2 and QP2 at junction point 13a. Thus, for LVPECL, the output comes from the drains of QP1/QP2 and QP3/QP4 connected in parallel. The pair QN3/QN4 is off. For LVDS, the output comes from the drains of QP1/QP2 and QN3/QN4. The pair QP3/QP4 is off. For HCSL, the output is the same as for LVPECL.

With this arrangement the LVPECL, LVDS, HCSL interfaces all advantageously operate with a current loop driver provided by different configurations of the transistor pairs QP1/QP2, QP3/QP4 and QN3/QP4.

An RC filter 16, 18 is present between the pairs of transistors QP1/QP2 and QP3/QP4, and the power rail $V_{DDO}$, and between QN3/QN4 and power rail $V_{SS}$. Power rail VDD is derived from VDDO via a voltage regulator (LDO), such that VDD=VDDO−0.25V. VDDO is the external VDDO, which has been defined above for the case of LVPECL mode. In other modes, an external relevant voltage is utilized to obtain VDD.

The filter 16 is the RC filter for the P-channel biasing transistors 41,42. The purpose of the filter 16 is to filter out high frequency noise. The presence of the filter does not alter the current source magnitude, but only the high frequency noise for the current source. The filter 18 works in a similar manner for the N-channel biasing transistors 44,45.

It will be noted, based on the explanation given above, that for HCSL and LVPECL, only the P-channel current loop is used, whereas for LVDS both the P-channel and N-channel current loops are used. In the case of current mismatch, the balance current comes from the differential amplifier 14.

The pre-driver module 12 (CML-to-Full-Swing) accepts an internal CML level signal and provides the set of full swing driving signals DA/DA', DB/DB', DC/DC' that have the magnitude swing from VL to VH, where VH and VL, representing logic states 1 and 0, respectively, are the driving voltages that come from internal regulators within the pre-driver module 12.

The full swing output of the pre-driver module 12 (typical CMOS type totem pole output) is preferably powered from internal regulators that establish logic 1 as VH and logic 0 as VL. VH does not necessarily equal $V_{DD}$, and VL does not necessarily equal $V_{SS}$. The actual values depend on the optimization of the biasing point, as will be discussed with reference to FIG. 6.

The differential amplifier 14 is couple-able in a negative feedback configuration to maintain the outputs 13, 11 (OUTP and OUTN) at the desired common mode level. The differential amplifier 14 has a non-inverting input connected to a switchable voltage reference provided by the pre-driver module 12 and an inverting input connected to respective first ends of sensing switches SW1 and SW2 via respective resistors 20, 21. A second end of sensing switch SW1 is connected to output line 13, also denoted OUTP. A second end of sensing switch SW2 is connected to output line 11, also denoted OUTN. The output of the differential amplifier 14 is connected via respective resistors 22, 23 and sourcing switches SW3, SW4 to the respective output lines 13, 11.

The switches SW1, SW2, SW3, SW4 are turned on and off by a control signal swctrl obtained by decoding the "formatting logic input" to the pre-driver module 12 in the decoder 12a. The differential amplifier 14 is also turned on and off by a signal Power_down_VCM. The signal Power_down_VCM is also obtained by decoding the "formatting logic input" signal to the pre-driver module 12 in the decoder 12a.

For LVPECL mode, the signal swctrl and Power_down_VCM set the switches SW1 to SW4 and the differential amplifier 14 to on. The voltage from "Switchable Ref voltage" output of the module 12 is about VDDO−1.55V to give the required common mode voltage for LVPECL. For LVPECL the outputs swing to VDDO−2 on one side and VDDO−2+0.9 on the other side so the common-mode level should be VDDO−2+(0.9)/2=VDDO−1.55.

For LVDS output the control signals swctrl and Power_down_VCM set the switches SW1 to SW4 and the amplifier 14 to on. The voltage from "Switchable Ref voltage" output of the module 12 is set to about VDDO−1.5V to give the required common mode voltage for LVDS.

For HCSL output the control signals swctrl and Power_down_VCM set the switches SW1 to SW4 and the amplifier 14 to off.

The output common mode level for LVPECL is different from the output common mode level of LVDS. For LVPECL the output common mode voltage would normally be VDD−1.3V. In this embodiment, VDDO is the output supply voltage. Because there is an internal low dropout regulator (not shown) providing VDD, which takes up 0.25V, the common mode voltage is actually set to VDDO−1.55V so as to take into account the regulator drop.

For LVDS the common mode voltage is 1.25V, so the switchable reference is set to VDDO−1.5V to account for the 0.25V drop on the internal regulator. The differential amplifier 14 provides the correct VCM in response to the switchable reference voltage provided by the pre-driver module 12.

In HCSL the Power_down_VCM signal is asserted and the differential amplifier 14 is turned off. When in the off state the differential amplifier 14 remains in a high impedance state.

To provide an LVDS output, the pre-driver module 12 is configured to drive the pair of transistors QP1/QP2 and QN3/QN4 via the respective DA, DA' and DC,DC' signals and hold the transistor pair QP3/QP4 in the off state by setting DB, DB' to a high output. The transistor pairs QP1/QP2 and QN3/QN4 provide the loop current needed for the LVDS format. The differential amplifier 14, also driven by the module 12, provides the output common mode voltage for the LVDS format. In this mode, the control signal swctrl sets the sensing switches SW1/SW2 and sourcing switches SW3/SW4 to on.

In order to determine the output format, the multi-format driver interface accepts the 2-bit external formatting logic in signal, and decodes it in the internal decoder 12a to a command to set the driver to LVPECL or LVDS or HCSL mode. This command is manifested in part as the control signals swctrl and pdown_N-channel and the switchable reference voltage being set to the appropriate value.

As noted above, in LVPECL mode the switches SW1 to SW4 are enabled and the output common mode voltage determined by the differential amplifier 14 is set to VDDO− 1.35V responsive to pre-driver module 12 selecting the appropriate switchable reference voltage. In LVDS mode switches SW1 to SW4 are enabled and the common mode voltage determined by the differential amplifier 14 is set to 1.25V responsive to pre-driver module 12 selecting the appropriate switchable reference voltage. In the HCSL mode, the switches SW1 to SW4 and the differential amplifier 14 are all turned OFF.

To provide an HCSL output, the pre-driver module 12 drives both the pair of transistors QP1/QP2 and QP3/QP4 and holds the pair QN3/QN4 is in off state. The current source QP1/QP2 provides the loop current needed for the HCSL format (about 15 mA). The differential amplifier 14 and the sensing switches SW1/SW2 and sourcing switches SW3/SW4 all held in the off state.

In this mode the transistor pairs QP1/QP2 and QP3/QP4 take turns to output the current on output lines 11, 13 from the current source 40 responsive to A, A' and B, B', respectively. Thus, when signal A' and B' are active, the current from current source 40 flows through OUTP and when signals A and B are active, current flows through OUTN.

The magnitude of the current depends on the inputs VP_bias and VP-cas to P-channel transistors 42, 42, which stack up to form a cascode configuration. The current flows alternately over the lines 11, 13 to a current sink at the receiver. The voltage nodes (ie "VP_bias and VP_cas") are generated from external current sources that serve as external bias currents on an external cascode pair of transistors (not shown).

To provide an LVPECL output, the transistor pairs QP1/QP2 and QP3/QP4 are driven from the pre-driver module 12. The transistor pairs QP1/QP2 and QP3/QP4 pass the loop current needed for the LVPECL format (about 18 mA). The pair QN3/QN4 is held in the off state. The differential amplifier 14 provides the output common mode voltage for LVPECL (VDDO−1.55) with the sensing switches SW1/SW2 and sourcing switches SW3/SW4 all on.

Implementing LVPECL as a current loop operation renders it more sensitive to parasitic capacitance of the printed circuit board. However, by so doing the inventors are able to reduce the die area. The inventors have found that the sensitivity to parasitic capacitance can be compensated with a slightly larger output transistor. The overall saving in die area outweighs the larger output transistors required.

It will be seen that in all cases the loading for the transistor pairs QP1/QP2, QP3/QP4, and QN3/QN4 on the driver module 12 are all one-to-one, i.e. there is no instance where one output of the pre-driver module is driving more than one input of the output circuit. This results in a power reduction and offers better signaling conditions.

The output loading in this exemplary embodiment according to the invention can be described as follows:

LVDS
QP1,QP2,QN3,QN4 (intrinsic)
QP3,QP4 (from all other formats)
LVPECL
QP1,QP2,QP3,QP4 (intrinsic)
QN3,QN4 (from LVDS)
Nothing (from HCSL)
HCSL
QP1,QP2,QP3,QP4 (intrinsic)
QN3,QN4 (from LVDS)
Nothing (from LVPECL)

In the exemplary embodiment described above, for noise reduction the filtering of the biasing current is achieved by the filters 16, 18.

The biasing point is achieved with the aid transistor pairs QP1/QP2 and QN3/QN4 for LVDS. The biasing point selection process determines the values for VH and VL that will give the lowest noise gain for the QP1/QP2 and QN3/QN4 transistors. A similar process is applied in the case of HCSL and LVDS except involving transistors QP1/QP2 and QP3/QP4 for LVPECL, and QP1/QP2 and QP3/QP4 for HCSL.

Figure 5:
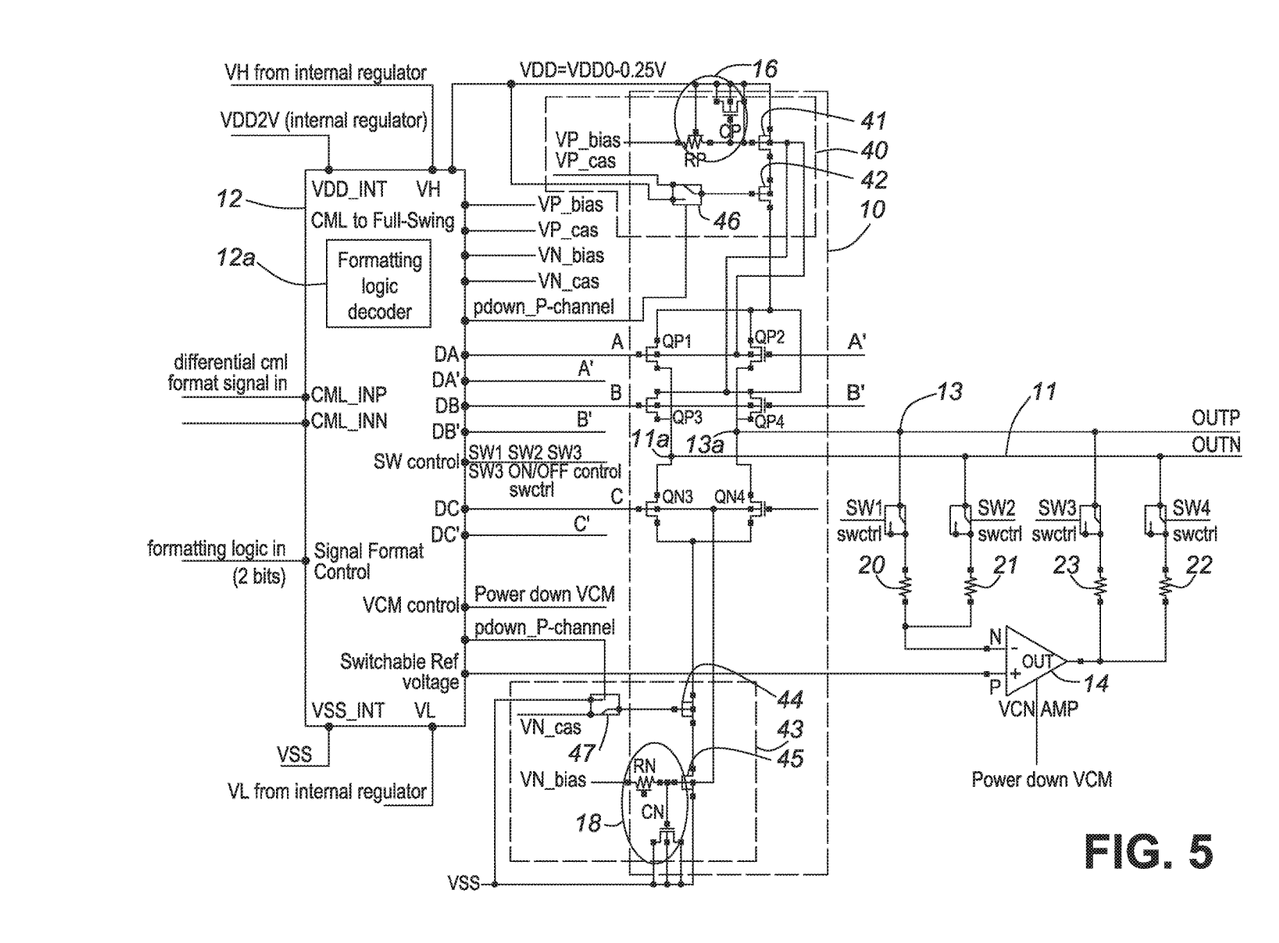
FIG. 5 is a schematic view of a multi-format driver in accordance with an embodiment of the invention.
Figure 6:
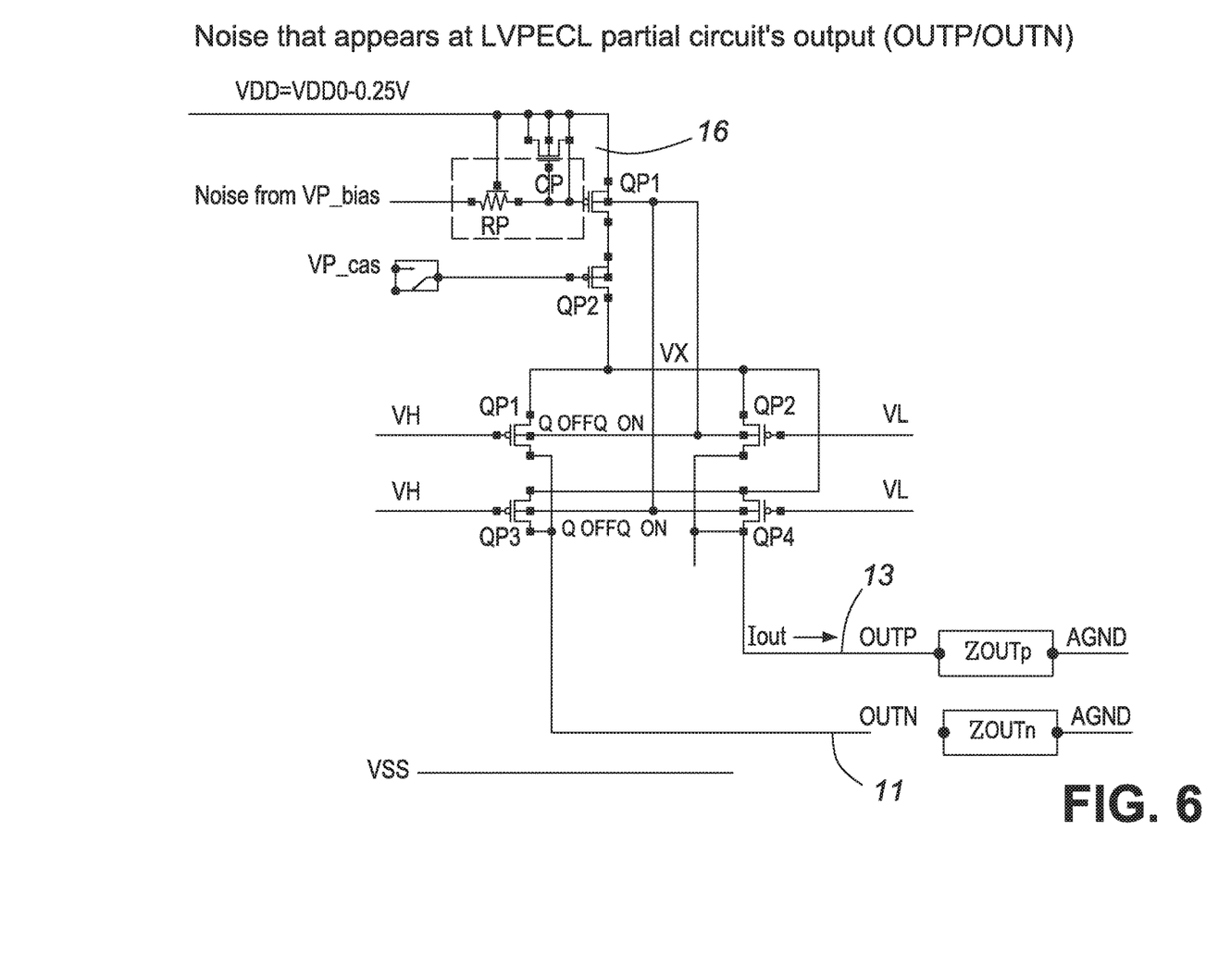
FIG. 6 shows some noise coupling paths in a multi-format driver configured for LVPECL in accordance with an exemplary embodiment of the invention.

The noise considerations will now be discussed with reference to FIG. 6, which is the equivalent circuit of FIG. 5 when the circuit of FIG. 5 is configured in the LVPECL mode. In FIG. 6 only transistors QP1/QP2 and QP3/QP4 are shown since transistors QN3/QN4 are in the off state.

In its stable state (logic 1), which means that the output 13 (outp) is high (VDD−1.1V in this example) and the output 11 (outn) is low (VDD−2V in this example) when the differential swing is such that one side is high and the other side is low, the noise gain is given by the expression:

$$\text{"Noise from } VP\_\text{bias" to OUT} P \sim \{1/(1+sCPRP)\}*gm(OP1)*ZOUTp$$

where CpRp is the filter 16 on the VP_bias voltage. The low pass pole provided by the filter is then $1/(1+s(Cp*Rp))$.

Consider the noise source before the filter 16 is Vn, the noise voltage after the RC filter is then given by $$Vn*1/(1+s(Cp*Rp)).$$

The ON transistors (the ones with the voltage VL at their gates) in the steady state will give out noise current (Iout) that has value of $$gm*Vn*1/(1+s(Cp*Rp)).$$

The noise voltage appearing at the output 13 (outp) is then equal to Iout*Zout, where Zout is the track and receiver impedance seen by the device on the printed circuit board.

Therefore the noise voltage at outp is given by the expression $$outp=gm*Vn*1/(1+s(Cp*Rp))*Zout, \text{ and}$$

hence, the noise gain at outp is given by the expression $$outp=gm*1/(1+s(Cp*Rp))*Zout$$

By selecting a value for VL such that the transistor is operating in its triode region, the term "gm" will be minimized, and so will the noise gain.

For the transistors that have VH at their gates, the transistors are OFF. The OFF transistors will not generate noise and thus do not appear in the noise equation. However, the value of VH is important because Vx−VH should be less than the threshold voltage of the OFF transistors (so that they can remain OFF), but VH should not be so high so that it lies in the cut off region.

A preferred value should be roughly equal to Vx (up to Vx+0.15V). In this way, the transistors can be switched on once their gates are hit by the VL level in the next cycle.

If desired, the output of the noise floor can be reduced by setting a lower pole for the filter 16, which will minimize the noise coupling from the current generator. Each driving circuit has its own Q factor, which is a ratio between its carrier frequency and its bandwidth. For a higher carrier frequency and due to a constant Q factor for a given circuit, the bandwidth is higher and thus the noise magnitude response of its sideband is higher (more noise). Conversely speaking, as the carrier frequency drops, the bandwidth becomes lower and the noise reduced. There comes a point when the noise magnitude response cannot drop any further, and this is known as the noise floor of the given circuit.

The input slew rate for switching transistors QP1/QP2 and QP3/QP4 is improved relative to the prior art due to the lighter loading. The better slew rate improves the transition noise by reducing the aperture time during the zero crossing of the differential output pairs of transistors QP1/QP2, QP3/QP4/This is also true of transistors QN3/QN4 shown in FIG. 5.

When line 13 (outp) is in the stable logic 1 state, the noise gain for the Q_ON transistors is preferably minimized. This can be achieved by forcing the Q_ON transistors in the "triode region" (i.e. VX−OUTP<0.2V), where VX is the voltage at the drains of the transistors QP1,QP2,QP3,QP4. The proper sizing and value of VL can achieve this goal.

The value of VH can be selected to be equal to or greater than VX. VL and VH are the voltages applied to the gates of transistors QP2/QP4 and QP1/QP3 respectively, and represent the low and high logic levels respectively.

VH and VL in conjunction with the sizing of the Q_ON and Q_OFF transistors can be tweaked to improve noise while in the stable output state.

Embodiments of the invention offer a circuit architecture for a high speed driver interface that can implement the LVPECL, LVDS, and HCSL signal format with a common set of output transistors and common mode amplifier without double-loading the output transistors of the circuit 10.

In the prior art multi-format approach that different drivers are in parallel with those that are unused and in the off state. Even in off state parasitic loading effects arise. For LVPECL and HCSL, the loadings are relatively high (in the range of 5 pF and possibly more). These loadings constrain the upper limit speed of the driver, as well as consuming more power. In fact, they also impact the phase noise performance as well because the output slew rate would be lower, giving out more noise to the next receiving device.

The single multi-format output driver stage has a lower output intrinsic parasitic loading than the prior art. Hence, it has a better output signal integrity for the same loading condition (maximum operating frequency, slew rate, and signal level).

The multi-format driver interface can operate with a wide range of supply voltages both regulated and unregulated. This topology is powered by an internal Low Dropout regulator (LDO) of magnitude VDDO−0.25V and can support all three signal formats for VDDO ranging from 2.5V to 3.3V (5% tolerance).

The multi-format interfaces in accordance with embodiments of the invention have a low input parasitic loading on the pre-driver module. It will be seen in FIG. 5 that the pre-driver module 12 in accordance with an embodiment of the invention drives three nodes formed by connection lines AA', BB', and CC' on a one-to-one, whereas in the prior art shown in FIG. 1, the similar module is double loaded in respect of the node CC'.

Because of this, the activated output differential pair in accordance with the invention can have a higher slew rate that will lower transition noise. The lower parasitic loading also leads to a lower overall power consumption.

Shared noise filtering circuits result in a lower surface area. Since the filtering operation consumes a fairly large die area, sharing them results in a much smaller die area for the same amount of filtering. The amount of filtering plays an important part in determining the noise floor of the drivers.

Embodiments of the invention also have the capability of better fine-tuning of the noise floor of the differential outputs. The LVPECL and HCSL configuration uses the same pair of output P-channel transistors, which can be fine-tuned with the proper sizing and selection of "VH" and "VL" to yield minimum noise gain for the P-channel pair. The LVDS will be using a subset of the P-channel transistors (which have the similar optimized biasing point as LVPECL and HCSL), and the N-channel transistors can be selected for LVDS format only.

It should be appreciated by those skilled in the art that any block diagrams herein represent conceptual views of illustrative circuitry embodying the principles of the invention. For example, a processor may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non volatile storage. Other hardware, conventional and/or custom, may also be included. The functional blocks or modules illustrated herein may in practice be implemented in hardware or software running on a suitable processor.

The invention claimed is:

1. A multi-format signal driver interface, comprising:
first and second current sources coupled to respective power rails;
first, second and third pairs of switching transistors coupled in a back-to-back relationship between said first and second current sources, first switching transistors of said first and second pairs of switching transistors forming a first parallel arrangement, and second switching transistors of said first and second pairs of switching transistors forming a second parallel arrangement, first switching transistors of said third pair of transistors being in series with said first parallel arrangement, and second switching transistors of said third pair of switching transistors being in series with said second parallel arrangement, sizing of said second pair of sizing transistors being greater than said first and third pairs of switching transistors;
a first output line coupled to a junction point between said first parallel arrangement and said first switching transistors of said third pair of switching transistors;
a second output line coupled to a junction point between said second parallel arrangement and said second switching transistors of said third pair of switching transistors;
a pre-driver module for generating control signals to configure said current sources and said switching transistors to output a selected signal format on said output lines; and
a differential amplifier selectively couple-able to said output lines for providing a common mode voltage.

2. A multi-format signal driver interface as claimed in claim 1, wherein the sizing of said second pair of transistors is made greater than said first and third pairs of transistors by providing said each of said second pair of transistors as multiple transistors arranged in parallel.

3. A multi-format signal driver interface as claimed in claim 1, wherein the sizing of said first and third pairs of transistors is the same, and said second pair of transistors have a sizing at least 3 times the sizing of said first and third pairs of transistors.

4. A multi-format signal driver interface as claimed in claim 1, which is implemented in 0.18 μm CMOS technology, and the sizing of the gates first and third pairs of transistors is 80 μm in width by 0.35 μm in length.

5. A multi-format signal driver interface as claimed in claim 1, further comprising a pair of sensing switches coupling a first input of said amplifier through respective resistors to said respective output lines, and a pair of sourcing switches coupling an output of said amplifier through respective resistors and to an output of said amplifier.

6. A multi-format signal driver interface as claimed in claim 5, wherein a second input of said differential amplifier is connected to an output of said pre-driver module providing a switchable voltage reference.

7. A multi-format signal driver interface as claimed in claim 5, wherein said pre-driver module includes a decoder to decode a formatting logic input signal to generate said control signals depending on the format selected by said formatting logic input signal.

8. A multi-format signal driver as claimed in claim 1, selectively operable in LVPECL, LVDS, and HCSL modes, and wherein in LVPECL and HCSL modes, said pre-driver module is configured to drive said first and second pairs of transistors, while holding said third pair of transistors in an off state, and in an LVDS mode said driver module is configured to drive said first and third pairs of transistors, while holding said second pair of transistors in an off state.

9. A multi-format signal driver as claimed in claim 8, wherein said pairs of sensing and sourcing switches are configured to be on in said LVDS and LVPECL modes and off in said HCSL mode.

10. A multi-format signal driver interface as claimed in claim 8, wherein said first and second pair of transistors are P-channel transistors, and said third pair of transistors are N-channel transistors, and said N-channel transistors are optimized for LVDS format.

11. A multi-format signal driver interface as claimed in claim 1, wherein each of said current sources comprises a pair of transistors in a cascode configuration.

12. A multi-format signal driver interface as claimed in claim 11, further comprising a switch coupled to a gate of one transistor of each pair of transistors forming said current sources to turn said respective current sources on an off in response to a command from said pre-driver module.

13. A multi-format signal driver as claimed in claim 11, further comprising a first RC filter between said first pair of transistors and one power rail, and a second RC filter between said third pair of transistors and another power rail.

14. A multi-format signal driver interface as claimed in claim 11, wherein said transistors forming said current sources are responsive to commands from said pre-driver module to set the desired current level based on the selected signal format.

15. A multi-format signal driver interface as claimed in claim 14, wherein said commands from said pre-driver module to set the desired current level based on the selected signal format are in the form of bias voltages applies to gates of the transistors forming the current sources.

16. A method of outputting a selected signal format employing a multi-format signal driver interface, comprising: first and second current sources coupled to respective power rails; first, second and third pairs of switching transistors coupled in a back-to-back relationship between said first and second current sources, first switching transistors of said first and second pairs of switching transistors forming a first parallel arrangement, and second switching transistors of said first and second pairs of switching transistors forming a second parallel arrangement, first switching transistors of said third pair of transistors being in series with said first parallel arrangement, and second switching transistors of said third pair of switching transistors being in series with said second parallel arrangement, sizing of said second pair of sizing transistors being greater than said first and third pairs of switching transistors; a first output line coupled to a junction point between said first parallel arrangement and said first switching transistors of said third pair of switching transistors; a second output line coupled to a junction point between said second parallel arrangement and said second switching transistors of said third pair of switching transistors; and a differential amplifier selectively couple-able to said output lines for providing a common mode voltage;

said method comprising:

in an LVPECL mode driving said first and second pairs of transistors while holding said third pair of transistors in an off state, and coupling said differential amplifier to said output lines to provide a common mode voltage;

in an HCSL mode driving said first and second pairs of transistors while holding said third pair of transistors in an off state while de-coupling said differential amplifier from said output lines; and in an LVDS mode driving said first and third pairs of transistors while holding said second pair of transistors in an off state, and coupling said amplifier to said output lines to provide a common mode voltage.

17. A method as claimed in claim 16, further comprising generating control signals to selectively couple and decouple said differential amplifier from the output lines depending on the selected mode.

18. A method as claimed in claim 17, wherein said control signals are obtained by decoding an input formatting logic signal.

19. A method as claimed in claim 17, wherein said control signals turn on and off said differential amplifier and switches coupling said amplifier to said output lines.

20. A method as claimed in claim 16, further comprising providing a first RC filter between said first pair of transistors and one power rail and a second RC filter between said third pair of transistors and another power rail.

21. A method as claimed in claim 16, wherein said first and second pair of transistors are P-channel transistors, and said third pair of transistors are N-channel transistors, and said N-channel transistors are optimized for LVDS format only.

22. A method as claimed in claim 16, wherein said current sources each comprise a pair of transistors in cascode configuration, said method further comprising generating commands to turn said current sources on and off depending on the selected mode.

23. A method as claimed in claim 22, further comprising generating biasing voltages to set the current level of said current sources based on the selected mode.

* * * * *